United States Patent [19]
Liou et al.

[11] Patent Number: 5,691,945
[45] Date of Patent: Nov. 25, 1997

[54] TECHNIQUE FOR RECONFIGURING A HIGH DENSITY MEMORY

[75] Inventors: Kong-Mou Liou, San Jose; Tom Dang-Hsing Yiu; Ray-Lin Wan, both of Milpitas, all of Calif.; Yao-Wu Cheng, Taipei; Chun-Hsiung Hung, Hsin-Chu, both of Taiwan; Ting-Chung Hu, Milpitas; Tien-Ler Lin, Saratoga, both of Calif.

[73] Assignee: Macronix International Co., Ltd., Hsinchu, Taiwan

[21] Appl. No.: 605,100

[22] PCT Filed: May 31, 1995

[86] PCT No.: PCT/US95/06990

§ 371 Date: Mar. 1, 1996

§ 102(e) Date: Mar. 1, 1996

[87] PCT Pub. No.: WO96/38845

PCT Pub. Date: Dec. 5, 1996

[51] Int. Cl.$^6$ .................................................. G11C 7/00
[52] U.S. Cl. .................................. 365/200; 365/185.09
[58] Field of Search ........................ 365/200, 230.03, 365/230.06, 185.09

[56] References Cited

U.S. PATENT DOCUMENTS

| | | | |
|---|---|---|---|
| 5,126,973 | 6/1992 | Gallia | 365/200 |
| 5,392,247 | 2/1995 | Fujita | 365/200 |
| 5,394,368 | 2/1995 | Miyamoto | 365/200 |
| 5,481,498 | 1/1996 | Han | 365/185.09 |
| 5,544,113 | 8/1996 | Kirihata | 365/200 |

*Primary Examiner*—David C. Nelms
*Assistant Examiner*—Son Mai
*Attorney, Agent, or Firm*—Wilson Sonsini Goodrich & Rosati

[57] ABSTRACT

A flexible technique for improving yield of manufacturing of high density of memory devices, such as flash EEPROM, involves reconfiguring an integrated circuit memory array having a plurality of sectors selected by an address decoder in response to an N bit field in an address. If defective sectors are detected in the array, it is partitioned to disable defective sectors by configuring a sector decoder to prevent access to the defective sectors while maintaining sequential addressing remaining sectors in the array. The step of partitioning includes configuring the sector decoder to replace a defective sector in one half of the array by another sector in the other half of the array having N-m of the N address bits in common with the defective sector when m is between 1 and N-1.

25 Claims, 7 Drawing Sheets

16 SECTORS ARE DIVIDED INTO TWO SECTIONS

|  |  | A19 | A18 | A17 | A16 |
|---|---|---|---|---|---|
| | SC 0 | 0 | 0 | 0 | 0 |
| | SC 1 | 0 | 0 | 0 | 1 |
| | SC 2 | 0 | 0 | 1 | 0 |
| | SC 3 | 0 | 0 | 1 | 1 |
| UPPER HALF | SC 4 | 0 | 1 | 0 | 0 |
| | SC 5 | 0 | 1 | 0 | 1 |
| | SC 6 | 0 | 1 | 1 | 0 |
| | SC 7 | 0 | 1 | 1 | 1 |
| | SC 8 | 1 | 0 | 0 | 0 |
| | SC 9 | 1 | 0 | 0 | 1 |
| | SC 10 | 1 | 0 | 1 | 0 |
| | SC 11 | 1 | 0 | 1 | 1 |
| LOWER HALF | SC 12 | 1 | 1 | 0 | 0 |
| | SC 13 | 1 | 1 | 0 | 1 |
| | SC 14 | 1 | 1 | 1 | 0 |
| | SC 15 | 1 | 1 | 1 | 1 |

FIG.2

16 SECTORS ARE DIVIDED INTO FOUR SECTIONS

|  |  | A19 | A18 | A17 | A16 |
|---|---|---|---|---|---|
| | SC 0 | 0 | 0 | 0 | 0 |
| PLANE 1 | SC 1 | 0 | 0 | 0 | 1 |
| | SC 2 | 0 | 0 | 1 | 0 |
| | SC 3 | 0 | 0 | 1 | 1 |
| | SC 4 | 0 | 1 | 0 | 0 |
| PLANE 2 | SC 5 | 0 | 1 | 0 | 1 |
| | SC 6 | 0 | 1 | 1 | 0 |
| | SC 7 | 0 | 1 | 1 | 1 |
| | SC 8 | 1 | 0 | 0 | 0 |
| PLANE 3 | SC 9 | 1 | 0 | 0 | 1 |
| | SC 10 | 1 | 0 | 1 | 0 |
| | SC 11 | 1 | 0 | 1 | 1 |
| | SC 12 | 1 | 1 | 0 | 0 |
| PLANE 4 | SC 13 | 1 | 1 | 0 | 1 |
| | SC 14 | 1 | 1 | 1 | 0 |
| | SC 15 | 1 | 1 | 1 | 1 |

FIG.3

TECHNIQUE FOR RECONFIGURING A HIGH DENSITY MEMORY

BACKGROUND OF THE INVENTION

1. Field of the Invention

The present invention relates to manufacturing of integrated circuit memory such as flash EEPROM and the like, and more particularly to techniques for improving the yield in manufacturing of high density memories.

2. Description of Related Art

In the manufacture of high density memories, such as flash EEPROM, designers push the limits of the manufacturing technology. This results in a number of defective devices being produced at any one manufacturing run. The ratio of defective devices to those which work satisfactorily is referred to as manufacturing yield.

Integrated circuit manufacturers use memory redundancy techniques to improve the yield in memory devices. That is, if a particular cell is detected bad, which resides along a particular row or column of the memory, a replacement column or a replacement row can be energized, and the address for the defective row or column redirected to the replacement row or column. This address redirecting preserves the sequential addressing of the data, while replacing a defective cell in the array. However, if there are more defective cells along a given row or column, than can be corrected using the redundancy built in the design, then the memory is bad and cannot be used.

In one prior art U.S. Pat. No. 4,489,401, manufacturing was yield improved by reconfiguring a device having an uncorrectable cell into two halves, where all of the cells in one half have a particular address bit in common. The resulting semiconductor structure will have a memory capacity equal to one half of the original array, and maybe packaged and sold as the smaller device. The technique in the '401 patent involves providing a programmable circuit with an address buffer on the device, which can permanently lock the output of the address buffer into one of the two buffer output states regardless of the address input bit. This makes it possible to isolate and disable every storage cell addressed by that address bit. However, the remaining devices in the array continue to have sequential addresses.

This prior art technique is limited in its application because it requires that no defective cells are found in at least one half of the array. If a defective cell occurs in each half, then device has to be discarded. To retain sequential addressing, this technique requires that only the highest order address bit be manipulated in this way. Otherwise, sophisticated manufacturing techniques which ensure that the address buffers are wired to particular pins on the chip package must be executed to match enabled address buffers with address bus lines.

Accordingly, it is desirable to provide a technique for partitioning a high density memory device to improve yield when defective segments of the array are found. However, the technique should be more flexible than the prior art, allowing for recovery and use of larger number of die in the manufacturing run.

SUMMARY OF THE INVENTION

The present invention provides a flexible technique for improving yield of manufacturing of high density memory devices, such as flash EEPROM. The technique involves configuring an integrated circuit memory array into a plurality of sectors selected by a sector decoder. If defective sectors are detected in the array, it may be partitioned by disabling defective sectors by configuring the sector decoder to prevent access to the defective sectors, while maintaining sequential addressing for remaining sectors in the array. The step of partitioning according to a preferred implementation includes configuring the sector decoder to replace a defective sector in the array identified by N address bits, by another sector in the array having N−m of the N address bits which identify a sector, in common with the defective sector.

Accordingly, in one approach of the present invention the step of partitioning includes configuring the sector decoder to enable a first subset and disable a second subset of the plurality of sectors in the array which have one (m=1) of the N address bits in common. A defective sector in the first subset is replaced by a good sector in a second subset having the other N−1 address bits in common with the defective sector. Therefore, the process supports a system in which defects are detected in both halves of the array. As long as a good sector in the bottom half which has the same N−1 bits as a bad sector in the top half can be found, then the top half of the device can be configured as a memory device with sequential addressing and one half the size of the original array.

Configuring the device at the sector decoding level rather than at the address buffer level as described by the prior art provides further advantages. In particular, sequential addressing can be achieved with any defective sector removed by providing configuration logic of sufficient depth, without requiring that the wiring from address input buffer to a pin on the package be altered.

Furthermore, in a memory array which comprises floating gate memory cells which are programmed by a process involving applying a negative voltage to wordlines connected to the cells, the step of partitioning may include preventing wordlines in disabled sectors from receiving the negative voltage.

According to one aspect of the invention, the step of partitioning involves providing a configuration store on the integrated circuit which is coupled to the sector level address decoder. In this case, the step of partitioning is accomplished by programming the configuration store.

Accordingly, the present invention can be characterized as an integrated circuit memory, such as a high density 16 megabit or higher flash EEPROM, which comprises an array of memory cells including a plurality of sectors. A decoder, responsive to memory addresses is used for accessing memory cells in the plurality of sectors. Programmable circuitry coupled to the decoder is used for configuring the decoder so that a subset including one or more of the plurality of sectors is disabled and remaining sectors are accessed by sequential addresses.

The plurality of sectors are identified by an N bit field in a memory address. The programmable circuitry includes logic which divides the array into a first subset including sectors having a particular m bit subfield of the N bits field at a first value, and a second subset including sectors having the particular m bit subfield of the N bit field different from the first value, and substitutes in the sequential addressing a defective sector in the first subset with a sector in the second subset having N−m bits of the N bit field in common with the defective sector. The simplest case involves a memory in which the variable m=1. Thus, where m=1, the first and second subsets each include half the sectors in the array. However, by providing a configuration store at the sector level, very flexible partitioning of the array can be exercised to make devices that are not only one half the original size, but also for instance that are one quarter the size of the original array, or three quarters size of the original array.

In addition, the present invention is easy to implement, not requiring complex changes to address input/output structures or to the array itself. Thus, the present invention provides an effective practical technique for improving the yield of manufacturing of high density memory devices such as flash EEPROMS.

Other aspects and advantages the present invention can be seen upon review of the figures, the detailed description and the claims which follow.

BRIEF DESCRIPTION OF THE FIGURES

FIGS. 2 and 3 illustrate the logic of configuring memory according to respective embodiments of the present invention.

DETAILED DESCRIPTION

Figure 1:
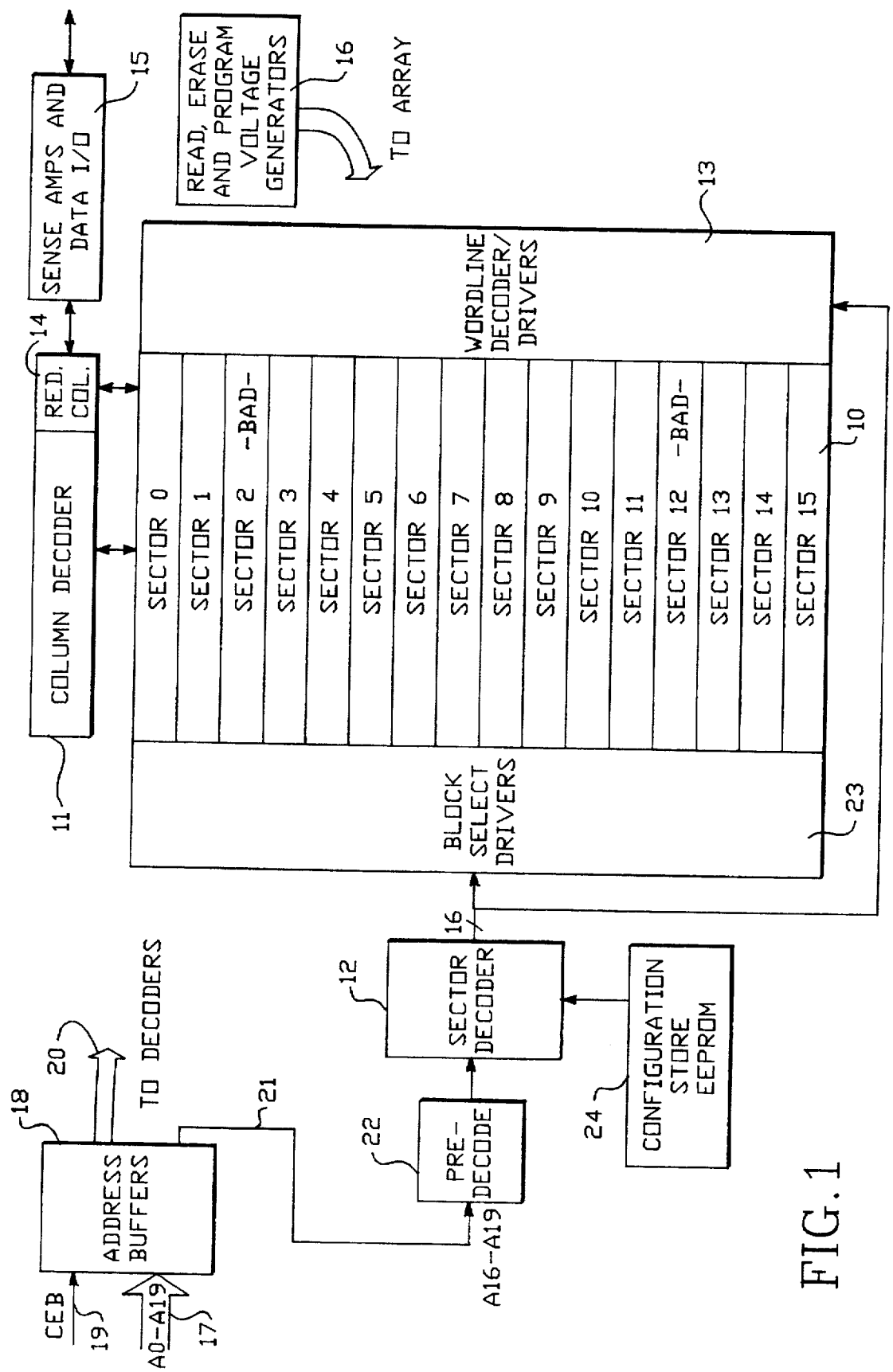
FIG. 1 is a schematic block diagram of a high density memory device with a plurality of sectors and a configuration store according to the present invention.

A detailed description of the present invention is provided with reference to the figures. FIG. 1 illustrates an architecture of a device using the configurable sector decoder according to the present invention. The device includes a high density memory array, generally 10, which includes a plurality of sectors: sector 0 through sector 15. The array 10 is decoded vertically by a column decoder 11, and decoded horizontally by sector decoder 12 and by the wordline decoder and drivers 13. Also in the embodiment shown, each of the sectors includes one or more redundant columns which are selected with a redundant column decoder 14 using techniques well known in the art. Also row redundancy may be used if desired.

Sense amplifiers and data input/output structures 15 are coupled to the column decoders 11. Read, erase, and program voltage generators 16 are coupled to the array for establishing the read, erase, and program voltages on a flash EEPROM memory array 10.

Address bits A0 through A19 are supplied on address bus 17 to a set of address buffers 18. This provides address space for sixteen megabits configured as one megaword. Also an active low chip enable signal CEB is supplied on line 19 to the address buffers 18. When the chip is enabled, the address buffers supply address signals on lines 20 to the decoders in the array. In the embodiment shown, the high order address bits A16 through A19 are supplied on line 21 to a sector pre-decoder 22, which in turn drives a sector decoder 12. The sector decoder 12 drives block select drivers 23 which selectively enable and disable the sectors, sector 0 through sector 15, in the array 10. According to the present invention, a configuration store 24 is included which is coupled to the sector decoder 12 for selectively configuring the sector decoder to enable or disable particular sectors in the array, while preserving sequential addressing response to the address bits on address bus 17.

Thus for instance, as illustrated in FIG. 1, if it is determined during device testing that sector 2 is bad and sector 12 is bad, the configuration store 24 can configure the sector decoder to disable the lower half of the array (sector 8 through sector 15), and enable the upper half of the array, sector 0 through sector 7. Sector 2 is then replaced by sector 10 in the sequential addressing. This provides an array one half the size of the original array which can be sequentially addressed.

According to one aspect of the invention, the configuration store 24 is a nine bit EEPROM register. The nine bits include eight sector flags SCFG (0–7) and one sector flag disable signal SCFGDIS. Using these nine bits, the array can be divided in half, by segmenting it into a first subset of sectors which has a particular address bit in the field A16 through A19 equal to one, and a second subset in which the particular address bit in the field is equal to zero. The sector flag bit can be set for a particular sector in the first subset which is bad. This causes the good sector in the other subset to be inserted in the sequential addressing in place of the bad sector. The good sector according to this scheme can be used to replace a bad sector, so long as three of the four bits in the field A19 through A16 are equal, and the fourth bit is different. Thus, for sector 2 in FIG. 1, sector 10 can be used to replace it. However, if sector 4 was bad in the system of FIG. 1, then it would be required according to this scheme to replace it with sector 12. However, because sector 12 is bad, this could not be done without more depth (i.e. more configuration bits) in the configuration store and logic.

FIG. 2 illustrates the logic of mapping address bits to particular sectors in a basic configuration of the present invention. As can be seen, sectors SC0 through SC7 have bit A19 equal to zero while sectors SC8 through SC15 have bit A19 equal to one. Sectors SC0 and SC8 have bits A18 through A16 in the low order 3 bit field in common. Thus, based on the field A18 through A16, sectors SC1 and SC9 match, sectors SC2 and SC10 match, sectors SC3 and SC11 match, sectors SC4 and SC12 match, sectors SC5 and SC13 match, sectors SC6 and SC14 match, and sectors SC7 and SC15 match.

Accordingly, once a defective sector is detected (e.g. sector SC0 or SC6), the sector flag disable bit is set, and the sector flags are set to identify the defective sector in the top half of the array. If the corresponding sector (e.g. sector SC8 or SC14) in the bottom half of the array is good, then the bad sector in the top half can be replaced with that sector in the lower half having matching bits A18 though A16. The algorithm for sorting the die according to this embodiment ignores address bit A19 if a defective sector is detected. Only those upper sectors which have the same coding of address bits A16, A17, A18 as a good sector in the lower half are replaceable. Thus, sector SC0 may be replaced only by sector SC8, and sector SC6 may only be replaced by sector SC14. If both the sectors in the upper and lower half with the matching A16 through A18 are defective, then the die is discarded or reconfigured as yet a smaller device. This provides a cheap and easy solution to improving yield in a manufacturing line, where a high density memory device such as a 16 megabit flash EEPROM can be reconfigured, packaged and sold as a smaller flash EEPROM such as an 8 megabit device while preserving sequential addressing.

FIG. 3 shows the logic for dividing 16 sectors into four sections to improve the replaceability of the die according to the present invention. Thus, address bits A19 and A18 are used to divide the 16 sectors into four planes. Plane 1 includes those sectors having address bits A19:A18 at 00. Plane 2 has address bits A19:A18 at 01. Plane 3 has address bits at A19:A18 at 10. Plane 4 has address bits A19:A18 at 11. According to this embodiment, the sectors in planes 3 and 4 are used to replace bad sectors in planes 1 or 2. If a defective sector is detected in the upper half comprised of planes 1 and 2, then a good sector selected from either plane 3 or plane 4 may be used to replace it. Thus, the candidates in planes 3 and 4 for replacement of sectors in planes 1 and 2 are those which have matching address bits A16 and A17 to the defective sector. Thus, as illustrated in the figure, sector SC0 in plane 1 may be replaced either by sector SC8 in plane 3 or by sector SC12 in plane 4. Similarly, sector SC4 in plane 2 may be replaced either by sector SC8 in plane 3 or by sector SC12 in plane 4.

This four plane embodiment illustrated in FIG. 3 requires 17 total fuses (bits in the configuration store). One fuse for disabling the lower half of the array, and sixteen fuses for identifying the sector to be used as the replacement. Sixteen fuses are required because two fuses are used for each sector in planes 3 and 4. One fuse for each sector is used to turn on the sector, and the other fuse in each sector is used for determining whether to flip bit A18 or not in order to replace a sector in plane 1 or plane 2.

Although the first option illustrated in FIG. 2 requires only 9 fuses and is simple to implement in circuit design and in the sort algorithm, it suffers the disadvantage that fewer die are capable of being corrected. In the option illustrated in FIG. 3, the probability that 3 defective sectors will be detected having the same coding of address bits A17:A16 is very small. Thus, the likelihood is much higher that a die with 8 good linearly addressed sectors will be found. The disadvantage of the second option is that 17 fuses are required, the sort program is more complicated, and it suffers a greater penalty in die size because of its complexity. With one more fuse to enable/disable plane 2 of the top half, the defective die could be reconfigured as either ½ or ¼ the original size.

The present invention extends to systems in which no address bits are shared between the defective and substitute sectors in the array. For instance, the 17 bit configuration store can be designed to provide one bit to disable address bit A19, four bits for selecting respective sectors SC0 through SC3 as substitute sectors, and twelve bits for assigning the address bits A16 through A18 for each of the four sectors so that they correspond to any defective sector in the lower half of the array. Thus, if a defect is found, the upper half of the array is disabled, and one or more of the sectors SC0 through SC3 is selected to replace any defective sector in the lower half.

This approach provides that any four defective sectors in the lower half of the array can be replaced by sectors SC0 through SC3, since address bits A16 through A18 are designed to be reconfigurable to redirect the address to any of the sectors SC8 through SC15. This eliminates the constraint in approaches described with reference to FIGS. 2 and 3, that a substitute sector must have one or more address bits in common with a defective sector.

Figure 4:
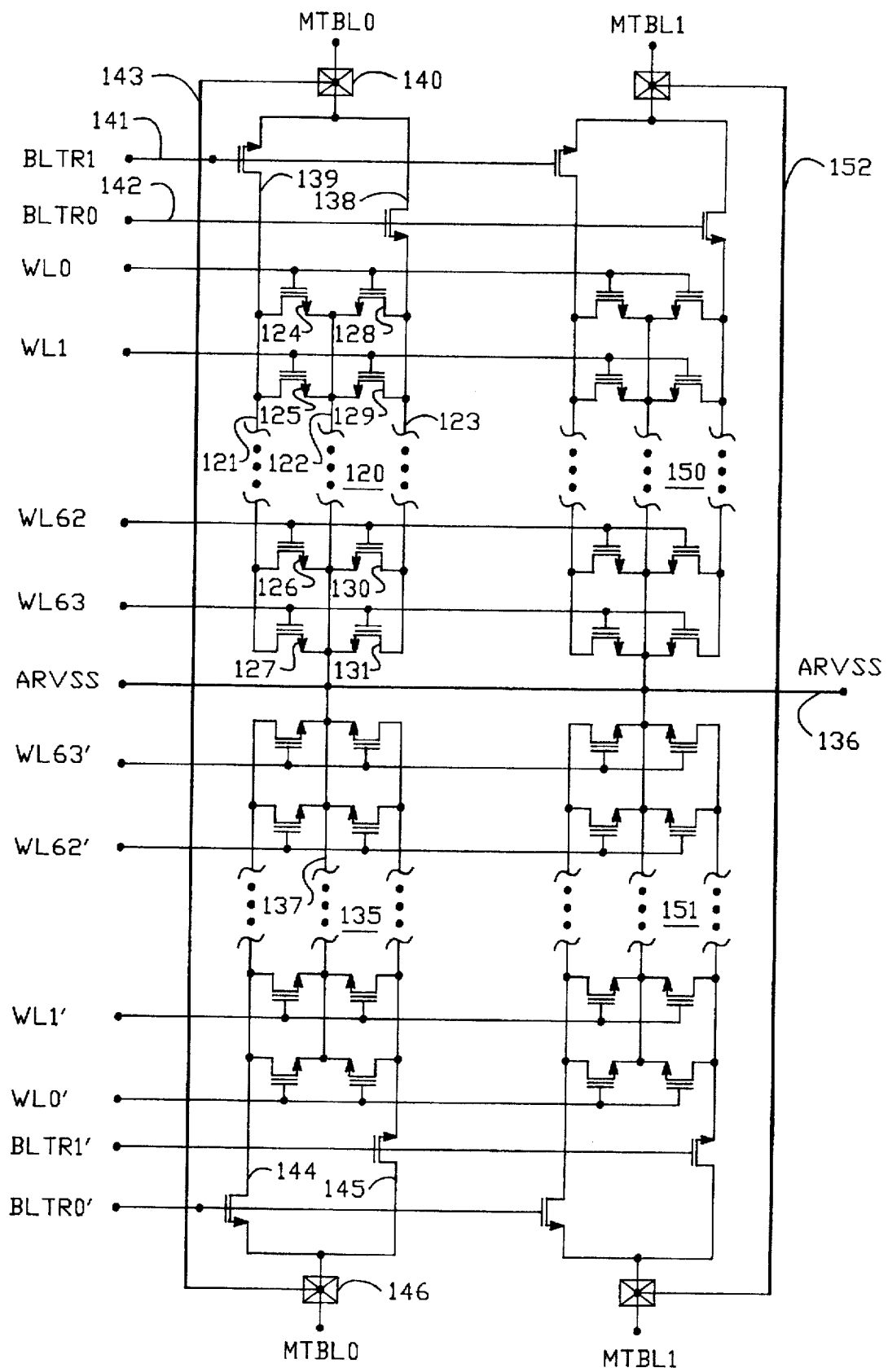
FIG. 4 is a circuit schematic diagram of a segmentable flash EEPROM array for use in the architecture of FIG. 1.

FIG. 4 illustrates one embodiment of a flash EEPROM array which might be used with the system of FIG. 1. FIG. 4 shows two pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Wordlines WL0 through WL63 each overlay the floating gates of cells in a first one of the pairs of columns and cells in the second one of the pairs of columns. As shown in the figure, a first pair 120 of columns includes one column including cell 124, cell 125, cell 126, and cell 127. Not shown are cells coupled to wordlines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The wordline WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

Each pair 120 of columns of cells shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

Column pairs are laid out horizontally and vertically to provide an array of flash EEPROM cells comprising M wordlines and 2N columns. The array requires only N metal bit lines each of which is coupled to a pair of columns of flash EEPROM cells through select circuitry, as described above.

Although the figure only shows four sub-blocks 120, 135, 150, and 151, coupled to two metal bit lines 143 and 152 (MTBL0–MTBL1), the array may be repeated horizontally and vertically as required to establish a large scale, sectored flash EEPROM memory array as shown in FIG. 1. Thus, column pairs 120 and 150 which share a wordline are repeated horizontally to provide a segment of the array.

The array is segmentable under control of the control signals BLTR1 and BLTR0. These signals are driven by the block select drivers 23 of FIG. 1 to divide the array into the sectors identified. Thus for an array which has 2K columns, and blocks 64 wordlines deep, each sector could be configured to include eight blocks per sector, for sixteen one megabit sectors.

According to the preferred embodiment of the present invention, the cells in the flash EEPROM are programmed by a process which involves applying a negative voltage to the wordline of a cell to be programmed, while applying a positive voltage or ground to the other wordlines. This process requires a wordline driver capable of applying both positive and negative to the wordlines in the array.

Figure 5:
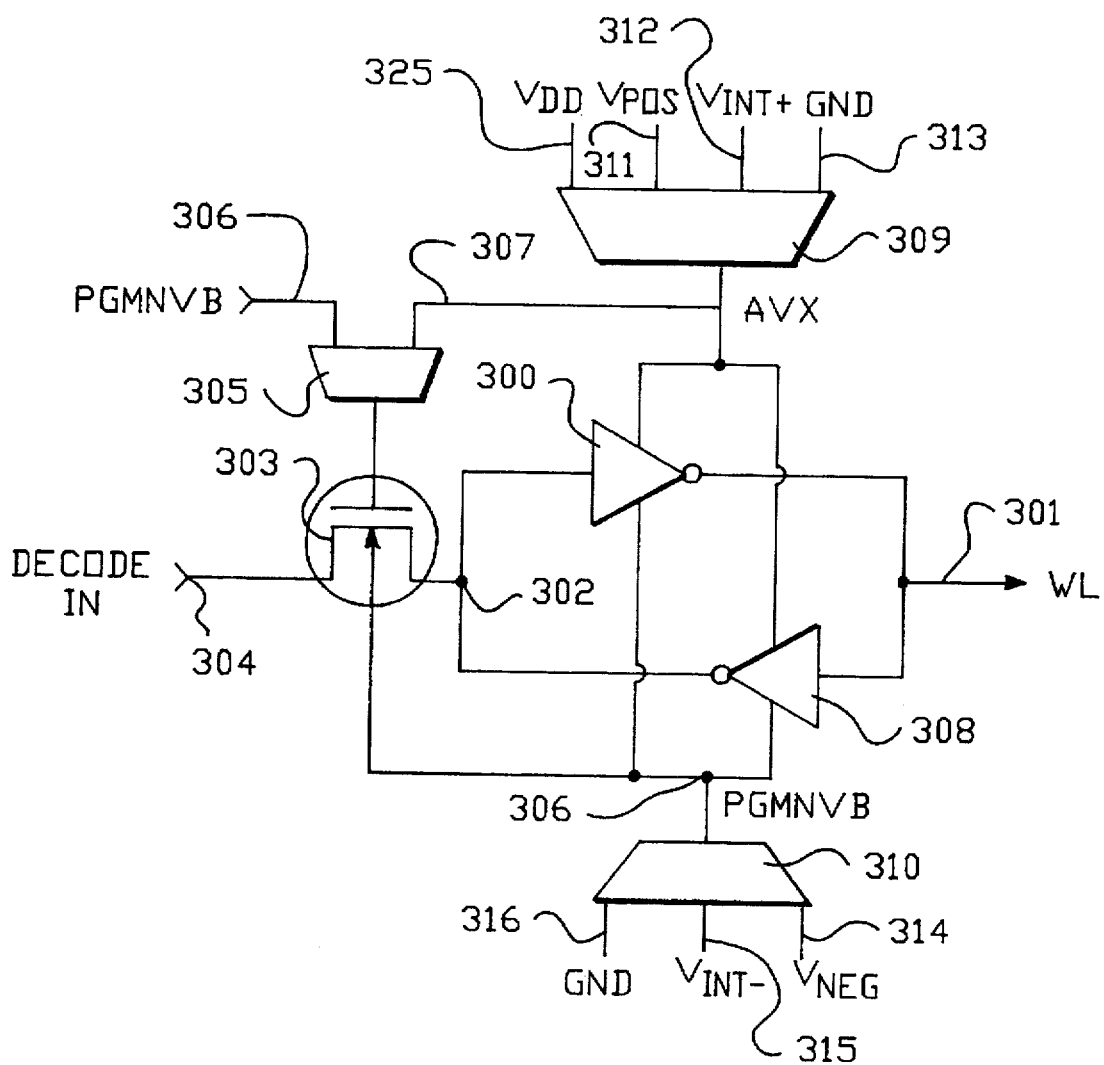
FIG. 5 is a schematic diagram of wordline driver used in a preferred embodiment of the system of FIG. 1, which supplies a negative voltage to wordlines in the array during programming.

FIG. 5 provides a basic block diagram of the wordline driver. The wordline driver includes a driver circuit which is implemented with inverter 300 having its output connected to wordline 301 and its input connected to node 302, which receives a wordline select signal from a decoder through an isolation circuit composed of transistor 303 formed in an isolated p-well. Transistor 303 has its source connected to node 302 and its drain connected to the decode input 304. The gate of transistor 303 is connected to a selector 305 which supplies either the signal PGMNVB on line 306 or the signal AVX on line 307. The driver also includes circuitry for holding the value of the wordline select signal at node 302 when the isolation transistor 303 is non-conducting. This circuit consists of inverter 308 which has its input connected to the wordline 301, and its output connected to node 302. Thus, the combination of inverters 300 and 308 form a storage element.

The power supply voltages AVX and PGMNVB are supplied through power supply selector circuitry 309 and 310, respectively. Although not shown, the selectors 309 and 310 are shared by a plurality of wordline drivers.

The selector 309 supplies a signal AVX on line 307 from among positive supply voltage $V_{DD}$ on line 325, a high positive voltage $V_{POS}$ on line 311, one or more intermediate positive voltages $V_{INT+}$ on line 312, and ground on line 313, which provides a reference potential. The selector 310 selects from among a negative potential $V_{NEG}$ on line 314, one or more intermediate negative voltages $V_{INT-}$ on line 315, and ground on line 316.

The inverter 300 operates to select either the value AVX for connection to the wordline 301, or the value PGMNVB for connection to the wordline 301 depending on the value of the wordline select signal from the decoder on line 304. The selectors 309, 310, and 305 are operated to establish a program mode, a read mode, and an erase mode under control of a mode control state machine on the chip.

During the erase mode, the selector 309 is operated to supply the high positive potential $V_{POS}$ to line 307 as the signal AVX. The selector 310 is operated to supply ground to line 306 as the signal PGMNVB. The selected wordline (i.e. wordlines in a sector to be erased during the erase mode) are charged to a +12 volts ($V_{POS}$) in the example described, while wordlines not selected are coupled to ground.

During the read mode, selector 309 is operated to supply the value $V_{DD}$ as the signal AVX, and the selector 310 is operated to supply ground.

During the program mode, according to the present invention, the selector 309 is operated to supply ground as the signal AVX, and the selector 310 is operated to supply the signal $V_{NEG}$ as the signal PGMNVB on line 306. There is also an intermediate mode during which the selectors 309 and 310 are operated to select the signals $V_{INT+}$ and $V_{INT-}$ during a transition from a read mode to a program mode, as explained in more detail below.

The selector 305 is operated to supply the signal AVX to a gate of transistor 303 during the read and erase modes, to leave transistor 303 in a conducting state. During the program mode, the signal PGMNVB on line 306 is applied to the gate. This is guaranteed to be as low as or lower than the value on node 302, turning off transistor 303, and isolating node 302 from the decoder.

The inverters 300 and 308 are composed of a p-channel transistor in series with an n-channel transistor. The n-channel transistors for both inverters are implemented in isolated p-wells, like transistor 303. The p-channel transistors for both inverters have channels biased at voltage AVW (not shown), which is relevant to the operation described below.

Details concerning implementation of the decoder are provided on our prior filed PCT Patent Application entitled DECODED WORDLINE DRIVER WITH POSITIVE AND NEGATIVE VOLTAGE MODES; Application No.: PCT/US95/01031; Filed: Jan. 26, 1995; Inventor(s): Yiu, et al., which is incorporated by reference as if fully set forth herein.

The wordline driver 600 operates in three modes:

A. "READ"

In the read mode, the decoder applies a positive voltage, setting a selected wordline to $V_{DD}$. Only one wordline is selected to AVX which is set at $V_{DD}$. The other wordlines are set at PGMNVB which is set at ground.

B. "ERASE"

In the erase mode, the decoder applies a positive voltage to selected wordlines at the high erase voltage level. Multiple wordline drivers, where each wordline driver may drive eight or more wordlines, are connected to the high erase voltage at the AVX terminal. A wordline set sequence is used to latch the address decoder input data. The value of AVX is switched from the $V_{DD}$ level to the high erase voltage.

C. "PROGRAM"

In program mode, the decoder applies a negative voltage to a selected wordline, where the negative is the high negative voltage generated at PGMNVB. Thus, a selected wordline is connected to PGMNVB, while all others are coupled to AVX. The programming sequence is as follows:

In a wordline set mode WLSET, all the wordlines are set to high read voltage $V_{DD}$. The signal AVX is set at 5 V, AVW (n-well bias for p-channel devices in WL driver inverters 300 and 308) is set at 5 V, PGMNVB is set at 0 V, and a state machine controls the decoders to sequentially flip the wordlines in the array to the positive value.

Next, a wordline select step occurs, in which one wordline driver is connected to the PGMNVB voltage. Then, a supply shift step is executed, which shifts the supply voltage AVX from +5 V to 0 V, and the supply voltage PGMNVB from 0, to −8 V. This shift is executed in a number of steps.

Finally, a program sequence is executed, in which the voltage AVX is 0 V, the voltage AVW is 3 V, and the PGMNVB voltage is −8 V on a selected wordline.

A program reset sequence is executed to move out of the program mode back to the read mode by changing the values PGMNVB to ground and AVX to +5 volts. In the program reset sequence, the value PGMNVB is switched directly to 0 volts, and AVX is moved up to 3 volts. In the next step, AVW is moved up to 5 volts. Finally, AVX is moved up to 5 volts, leaving the voltages set up for the normal read mode.

This sequence presents a unique problem to segmenting the array as discussed above. In particular, the disabled sectors in the array have to be conditioned so that they are driven to ground, rather than to a negative voltage during the program operation. If they were exposed to the negative voltage, then the driving power of the negative voltage generator, normally implemented using charge pump technology, might be easily overcome, and prevent successful segmentation of the array. That is, each of the wordlines must be accessible during the wordline set step outlined above so that it can be set to a positive value prior to the supply shift step. If the wordlines were simply disconnected, as done in the prior art, then this process could not be carried out, and when the supply shift was executed, the supply voltage on the wordline driver for the disabled sector would be driven to the negative value. Thus, control logic associated with the sector decoder must be coupled with the mode control logic for the read/program and erase cycles on the device according to this aspect of the present invention.

Figure 6:
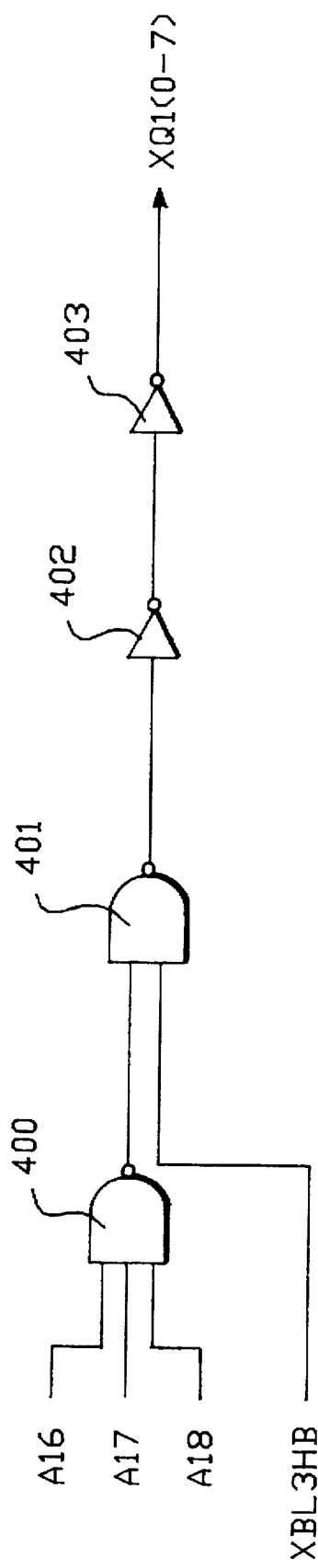
FIG. 6 is a logic diagram for a pre-decoder for address bits A16–A18 for the system of FIG. 1.
Figure 7:
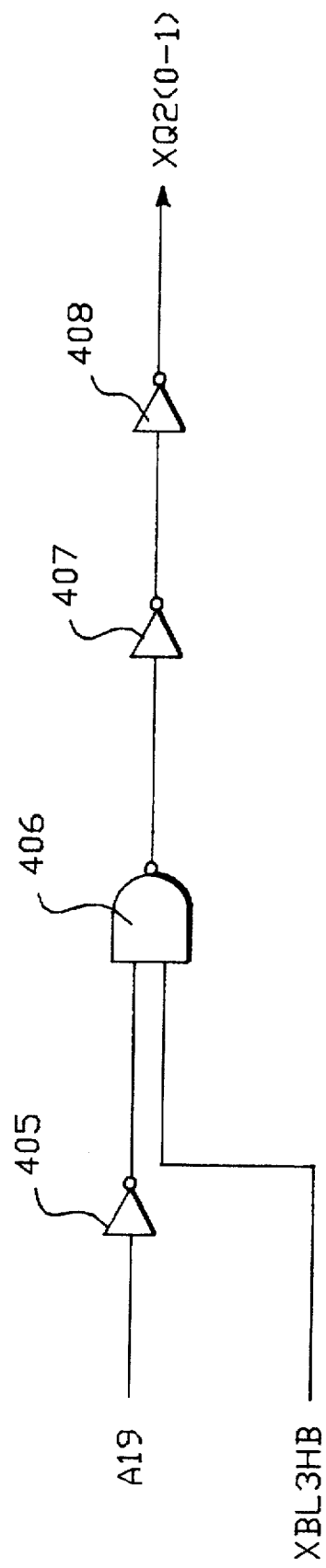
FIG. 7 is the logic for address bit A19 in the pre-decoder in the system of FIG. 1.

FIGS. 6 through 11 illustrate the sector decoding logic for used according to a preferred embodiment of the present invention. FIG. 6, a pre-decoding logic for address bits A16 through A18 is illustrated. FIG. 7 shows the pre-decoding for A19.

As shown in FIG. 6, one of eight decoders is shown, in which three inputs to NAND gate 400 correspond to high or low states of address bits A16 through A18. It will be appreciated that eight different configurations of the input signals can be generated to the eight different pre-decoder stages. The output of the NAND gate 400 is supplied to a two input NAND gate 401. The second input into the NAND gate 401 is a control signal XBL3HB, which enables or disables sector decoding.

The output of the NAND gate 401 is supplied through inverters 402 and 403 to supply a pre-decode output signal XQ1 (0–7).

Address bit A19 is pre-decoded using the logic shown in FIG. 7. Thus, address bit A19 is supplied through inverter 405 to a first input of NAND gate 406. The second input of the NAND gate 406 is the control signal XBL3HB. The output of the NAND gate 406 is supplied through inverter 407 and inverter 408 to generate the decode signal XQ2 (0–1).

Figure 8:
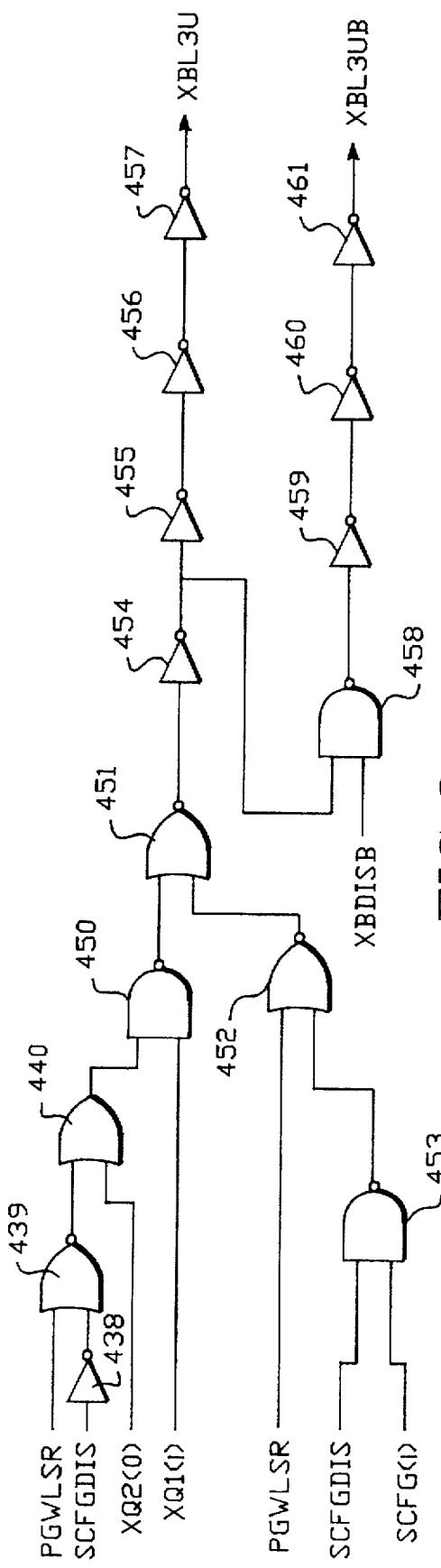
FIG. 8 illustrates logic in the sector decoder for an upper half of the array.
Figure 9:
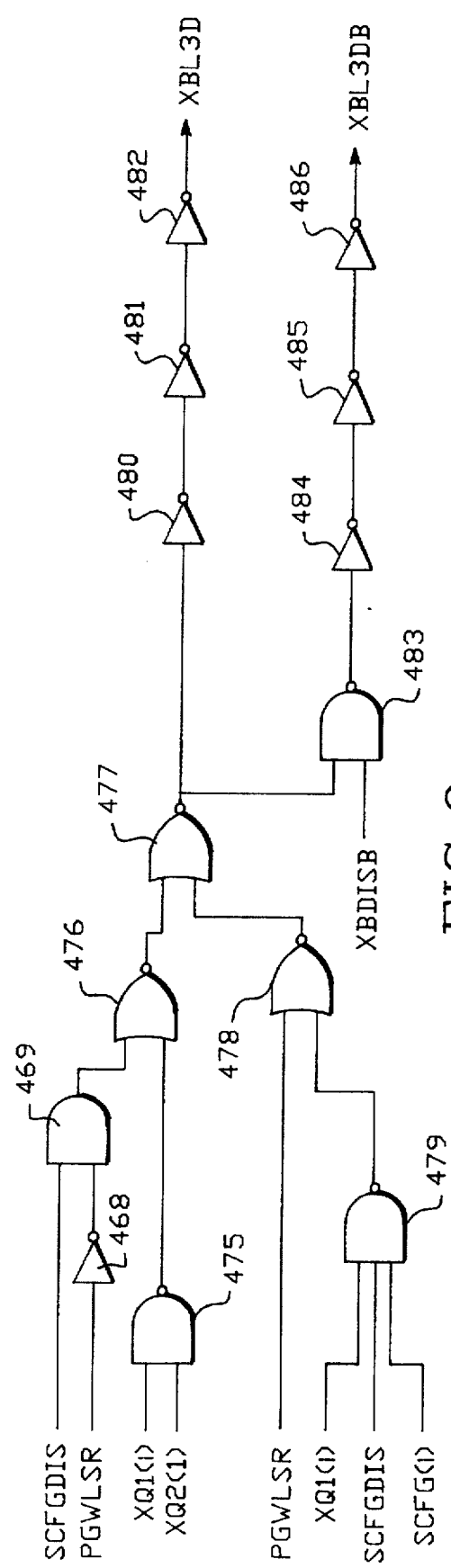
FIG. 9 illustrates logic in the sector decoder for the lower half of the array.

The ten pre-decode signals XQ1 (0–7) and XQ2 (0–1) are supplied to a sector decoder which includes the logic shown in FIG. 8 for the upper half of the array, and the logic shown in FIG. 9 for the lower half of the array. Thus, for each pre-decode signal XQ1(i), the logic shown in FIG. 8 is implemented. Thus, XQ1(i) supplies a first input to NAND gate 450. The second input to NAND gate 450 is the output of OR gate 440. A first input to OR gate 440 is pre-decode signal XQ2(0). The second input to OR gate 440 is the output of NOR gate 439, which has the inverse of the SCFGDIS signal (sector flag disable) from inverter 438 as one input, and the PGWLSR signal (indicating a page programming sequence) as a second input. The output of the NAND gate 450 is supplied as a first input to NOR gate 451. The second input to NOR gate 451 is the output of NOR gate 452. Inputs to NOR gate 452 include the signal PGWLSR, and the output of NAND gate 453. NAND gate 453 receives the configuration data, including a sector flag disable signal SCFGDIS, and a sector flag SCFG(i) signal for the corresponding sector. Also, when SCFGDIS is high and PGWLSR is low, NOR gate 439 generates a high output, overriding XQ2(0) during the page programming sequence when the array is segmented.

NOR gate 451 drives the string of inverters 454, 455, 456, 457 to generate the output signal XBL3U. The output of inverter 454 is supplied as an input to NAND gate 458. The output of NAND gate 458 is supplied through inverters 459, 460, and 461 to generate the output signal XBL3UB. The second input to NAND gate 458 is the control signal XBDISB used during the program set up sequence.

In the event that the array is segmented, the sector flag disable signal SCFGDIS will be high, and the sector flag SCFG(i) will also be high for the bad sector. This will cause the output of the NAND gate 453 to be low, and the output of the NOR gate 452 to be high. This will disable NOR gate 451 from changing in response to the pre-decode signals XQ1(i) and XQ20 and isolate the bad sector. Also, when SCFGDIS is high and PGWLSR is low, NOR gate 439 generates a high output, overriding XQ2(0) during the page programming sequence when the array is segmented.

On the other hand, the lower segment of the array is decoded using the logic of FIG. 9. In this logic, the pre-decode signals XQ1(i) and XQ2(1) are supplied as inputs to NAND gate 475. The output of NAND gate 475 is supplied as a first input to NOR gate 476. The second input of NOR gate 476 is the output of AND gate 469. Inputs to AND gate 469 include SCFGDIS and the inverse of PGWLSR through inverter 468. The output of NOR gate 476 is a first input to NOR gate 477. The second input to NOR gate 477 is the output of NOR gate 478. The inputs to NOR gate 478 include the control signal PGWLSR, and the output of the NAND gate 479. NAND gate 479 receives as inputs the pre-decode signal XQ1(i), the sector flag disable signal SCFGDIS, and the sector flag SCFG(i).

The output of the NOR gate 477 supplies the series including inverter 480, inverter 481, and inverter 482 which supplies the output signal XBL3D. Also the output of NOR gate 477 supplies a first input to NAND gate 483. The NAND gate 483 drives a sequence of inverters 484, 485, and 486 which supplies the output signal XBL3DB. A control signal XBDISB is supplied as a second input to the NAND gate 483.

Thus, the lower sector is disabled in response to the sector flag disable signal SCFGDIS. When SCFGDIS is high, and PGWLSR is low, the output of AND gate 469 is high which causes the output of NOR gate 476 to be low overriding the address signals reflected in XQ1(i) and XQ2(1). In this case, the output of NOR gate 477 is controlled by NAND gate 479 which changes if the corresponding sector is selected as indicated by SCFG(i) when SCFGDIS is high. When the sector is selected, then the output of NOR gate 477 changes with the control signal XQ1(i) while the corresponding sector in the top half is disabled (NAND gate 453 of FIG. 8). Else, the sector is disabled by NAND gate 479.

Figure 10:
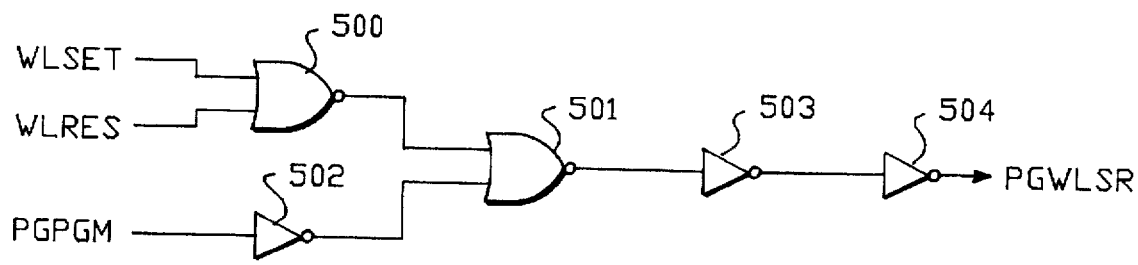
FIG. 10 illustrates control logic used in conjunction with the sector decoder of FIG. 9.

The control signal PGWLSR is asserted in the program wordline set and reset sequence described above. Thus, the disabling of the sector decoder which occurs due to the configuration store is overridden during this sequence in response to this signal. The PGWLSR signal is generated using logic such as illustrated in FIG. 10, where control signals corresponding to the wordline set and wordline reset sequences are supplied as inputs to NOR gate 500. The output of the NOR gate 500 is supplied as an input to NOR gate 501. The second input to NOR gate 501 is supplied at the output of inverter 502 which receives as inputs the page program mode control signal. The output of the NOR gate 501 is supplied through inverters 503 and 504 to generate the PGWLSR signal used in the logic of FIGS. 8 and 9.

Figure 11:
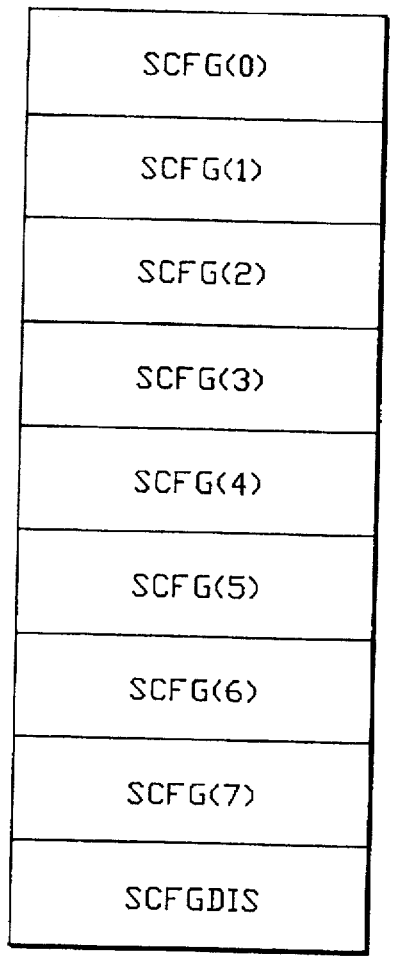
FIG. 11 is a schematic illustration of the configuration store for use with the decoder of FIG. 9.

FIG. 11 functionally illustrates the configuration store for the basic embodiment of FIGS. 2 and 7–10. As can be seen, it comprises a 9 bit non-volatile register, implemented using floating gate memory cells, fuses, on antifuses, laser cut nodes, or the like for the purposes of generating the sector flag signals SCFG(0) through SCFG(7), and the sector flag disable signal SCFGDIS.

Accordingly, using a segmentable high density memory device, such as a 16 megabit or higher flash EEPROM array, and a configuration store which is capable of configuring the sector level decoding of the device, a powerful technique is provided for improving yield of the manufacturing line. Die which would normally be discarded can be reconfigured as a smaller device while preserving sequential addressing. With the sequential addressing, the die can be packaged as if it were a smaller device, and sold. Furthermore, the sector level decoding allows for sophisticated reconfiguration of the array without the necessity of complex wiring steps in the manufacture to make sure that a particular address buffer is coupled to a particular address pin as would be required using the prior art approach.

The present invention is particularly significant because of the small amount of logic required to implement it, requiring very little real estate on the integrated circuit. Thus, high density memory devices, in which chip area is at a premium, can be effectively and inexpensively provided with tools needed for reconfiguring bad high density devices as a good lower density devices, thereby improving manufacturing yield and reducing waste.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for configuring an integrated circuit memory array having an address space and a plurality of sectors selected by an address decoder in response to an N bit field in an address, the address space defined by the N bit field, the method comprising:

detecting defective sectors in the plurality of sectors; and
   if defective sectors are detected in the plurality of sectors, partitioning the plurality of sectors to disable defective sectors by configuring the address decoder reduce the address space to prevent access to the defective sectors while maintaining sequential addressing of remaining sectors in the plurality of sectors.

2. The method of claim 1, wherein the step of partitioning includes configuring the address decoder to replace a defective sector in the array by another sector in the array having N−m of the N address bits address bits in common with the defective sector, where m is between 1 and N−1.

3. The method of claim 1, wherein the step of partitioning includes configuring the address decoder to enable a first subset and disable a second subset of the plurality of sectors having p of the N address bits in common, and to replace a defective sector in the first subset by another sector in the second subset having at least one of the other N−p address bits in common with the defective sector, where p is between 1 and N−1.

4. The method of claim 1, wherein the memory array comprises floating gate memory cells which are programmed by a process involving applying a negative voltage to wordlines connected to the cells, and the step of partitioning includes preventing wordlines in disabled sectors from receiving the negative voltage.

5. The method of claim 1, including providing a configuration store on the integrated circuit coupled to the address decoder, and wherein the step of partitioning includes storing configuration data in the configuration store.

6. An integrated circuit memory, comprising:

an array of memory cells including a plurality of sectors;
   a decoder, responsive to memory addresses within an address space, to access memory cells in the plurality of sectors; and
   programmable circuitry to configure the decoder so that the address space is reduced and a subset including one or more of the plurality of sectors is disabled and remaining sectors are accessed by sequential addresses.

7. The integrated circuit memory of claim 6, wherein the plurality of sectors are identified by an N bit field in a memory address, and the disabled subset includes sectors having m of the N bits in common, where m is between 1 and N−1.

8. The integrated circuit memory of claim 6, wherein the plurality of sectors are identified by an N bit field in a memory address, and the programmable circuitry includes logic which divides the array into a first subset including sectors having a particular p bit subfield of the N bit field at a first value, and a second subset including sectors having the particular p bit subfield of the N bit field different than the first value, and substitutes in the sequential addressing a defective sector in the first subset with a sector in the second subset having at least one of the other N−p bits of the N bit field in common with the defective sector, where p is between 1 and N−1.

9. The integrated circuit memory of claim 8, wherein p equals 1.

10. The integrated circuit memory of claim 8, wherein N is greater than or equal to 4.

11. The integrated circuit memory of claim 6, including:

a plurality of wordline drivers, wordline drivers in the plurality having a first mode which selectively drives a positive voltage or a first mode reference voltage to wordlines in the array, and second mode which selectively drives a negative voltage or a second mode reference voltage to the wordlines; and
    logic to prevent the negative voltage from being applied to wordlines in disabled sectors.

12. The integrated circuit memory of claim 6, wherein the programmable circuitry includes a configuration store comprising floating gate memory cells for storing configuration data.

13. An integrated circuit memory, comprising:

an array of floating gate memory cells including a plurality of sectors, wherein the plurality of sectors are identified by an N bit field in a memory address having an m bit subfield and an N-m bit subfield;
    read, program and erase resources which program using a process which involves applying a negative voltage to a wordline of a cell to be programmed;
    a decoder, responsive to memory addresses, to access memory cells in the plurality of sectors;
    programmable circuitry to configure the decoder so that one or more of the plurality of sectors is disabled and remaining sectors are accessed by sequential addresses, including logic which divides the array into a first subset including sectors having a particular m bit subfield of the N bit field at a first value, and a second subset including sectors having the particular m bit subfield of the N bit field different than the first value, and substitutes in the sequential addressing a defective sector in the first subset with a substitute sector in the second subset; and logic which prevents the negative voltage from being applied to wordlines in disabled sectors.

14. The integrated circuit memory of claim 13, wherein the substitute section has at least one of the N−m bit subfield of the N bit field in common with the defective sector.

15. The integrated circuit memory of claim 14, wherein m equals 1.

16. The integrated circuit memory of claim 15, wherein N is greater than or equal to 4.

17. The integrated circuit memory of claim 13, wherein the programmable circuitry includes a configuration store comprising floating gate memory cells for storing configuration data.

18. A method for configuring an integrated circuit memory array having a plurality of sectors selected by an address decoder in response to an N bit field in an address, comprising:

detecting defective sectors in the array; and partitioning the array to disable defective sectors by configuring the address decoder to prevent access to the defective sectors while maintaining sequential addressing of remaining sectors in the array; and wherein the step of partitioning includes configuring the address decoder to replace a defective sector in the array by another sector in the array having N−m of the N address bits address bits in common with the defective sector, where m is between 1 and N−1.

19. A method for configuring an integrated circuit memory array having a plurality of sectors selected by an address decoder in response to an N bit field in an address, comprising:

detecting defective sectors in the array; and partitioning the array to disable defective sectors by configuring the address decoder to prevent access to the defective sectors while maintaining sequential addressing of remaining sectors in the array; and wherein the step of partitioning includes configuring the address decoder to enable a first subset and disable a second subset of the plurality of sectors having p of the N address bits in common, and to replace a defective sector in the first subset by another sector in the second subset having at least one of the other N−p address bits in common with the defective sector, where p is between 1 and N−1.

20. A method for configuring an integrated circuit memory array having a plurality of sectors selected by an address decoder in response to an N bit field in an address, comprising:

detecting defective sectors in the array;

partitioning the array to disable defective sectors by configuring the address decoder to prevent access to the defective sectors while maintaining sequential addressing of remaining sectors in the array; and wherein the memory array comprises floating gate memory cells which are programmed by a process involving applying a negative voltage to wordlines connected to the cells, and the step of partitioning includes preventing wordlines in disabled sectors from receiving the negative voltage.

21. An integrated circuit memory, comprising:

an array of memory cells including a plurality of sectors;

a decoder, responsive to memory addresses, to access memory cells in the plurality of sectors; and programmable circuitry to configure the decoder so that a subset including one or more of the plurality of sectors is disabled and remaining sectors are accessed by sequential addresses; and wherein the plurality of sectors are identified by an N bit field in a memory address, and the disabled subset includes sectors having m of the N bits in common, where m is between 1 and N−1.

22. An integrated circuit memory, comprising:

an array of memory cells including a plurality of sectors;

a decoder, responsive to memory addresses, to access memory cells in the plurality of sectors; and programmable circuitry to configure the decoder so that a subset including one or more of the plurality of sectors is disabled and remaining sectors are accessed by sequential addresses; and wherein the plurality of sectors are identified by an N bit field in a memory address, and the programmable circuitry includes logic which divides the array into a first subset including sectors having a particular p bit subfield of the N bit field at a first value, and a second subset including sectors having the particular p bit subfield of the N bit field different than the first value, and substitutes in the sequential addressing a defective sector in the first subset with a sector in the second subset having at least one of the other N−p bits of the N bit field in common with the defective sector, where p is between 1 and N−1.

23. The integrated circuit memory of claim 22, wherein p equals 1.

24. The integrated circuit memory of claim 22, wherein N is greater than or equal to 24.

25. An integrated circuit memory, comprising:

an array of memory cells including a plurality of sectors;

a decoder, responsive to memory addresses, to access memory cells in the plurality of sectors;

programmable circuitry to configure the decoder so that a subset including one or more of the plurality of sectors is disabled and remaining sectors are accessed by sequential addresses;

a plurality of wordline drivers, wordline drivers in the plurality having a first mode which selectively drives a positive voltage or a first mode reference voltage to wordlines in the array, and second mode which selectively drives a negative voltage or a second mode reference voltage to the wordlines; and logic to prevent the negative voltage from being applied to wordlines in disabled sectors.

* * * * *